United States Patent
Lin et al.

(10) Patent No.: US 12,543,373 B2
(45) Date of Patent: Feb. 3, 2026

(54) ELECTRONIC DEVICE INCLUDING CONDUCTIVE LAYER DISPOSED BETWEEN SUBSTRATE AND ELECTRONIC ELEMENT

(71) Applicant: Innolux Corporation, Miaoli County (TW)

(72) Inventors: Yi-Hung Lin, Miaoli County (TW); Hsiu-Yi Tsai, Miaoli County (TW); Chia-Ping Tseng, Miaoli County (TW); Chia-Chi Ho, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 687 days.

(21) Appl. No.: 17/956,846

(22) Filed: Sep. 30, 2022

(65) Prior Publication Data

US 2023/0131442 A1 Apr. 27, 2023

Related U.S. Application Data

(60) Provisional application No. 63/270,560, filed on Oct. 21, 2021.

(30) Foreign Application Priority Data

Jul. 4, 2022 (CN) .......................... 202210779816.3

(51) Int. Cl.
  *H10D 86/60* (2025.01)
  *H10D 86/40* (2025.01)
(52) U.S. Cl.
  CPC ........... *H10D 86/60* (2025.01); *H10D 86/411* (2025.01); *H10D 86/471* (2025.01)

(58) Field of Classification Search
  CPC ..... H10D 86/60; H10D 86/411; H10D 86/471
  (Continued)

(56) References Cited

U.S. PATENT DOCUMENTS

| 2001/0019384 | A1  | 9/2001 | Murade |
| 2015/0206929 | A1* | 7/2015 | Sato ..................... H10K 59/123 257/40 |
| 2015/0262897 | A1* | 9/2015 | Chen ..................... G02F 1/1368 257/48 |

FOREIGN PATENT DOCUMENTS

| CN | 105164743 | 5/2018 |
| CN | 112394559 | 2/2021 |

(Continued)

OTHER PUBLICATIONS

"Office Action of Taiwan Counterpart Application", issued on Mar. 3, 2023, p. 1-p. 4.

(Continued)

*Primary Examiner* — Norman D Richards
*Assistant Examiner* — Colin Russell Mccutcheon
(74) *Attorney, Agent, or Firm* — JCIPRNET

(57) ABSTRACT

An electronic device includes a substrate, a driving element, a conductive layer, and an electronic element is provided. The driving element is disposed on the substrate. The conductive layer is disposed on the substrate, wherein there is a first distance (B) between the driving element and an edge of the conductive layer. The electronic element is disposed on the conductive layer and is electrically connected to the driving element, wherein there is a second distance (A) between the electronic element and the edge of the conductive layer, and the first distance (B) is greater than the second distance (A).

19 Claims, 13 Drawing Sheets

(58) Field of Classification Search
USPC .......................................................... 257/40
See application file for complete search history.

(56) References Cited

FOREIGN PATENT DOCUMENTS

| | | | | |
|---|---|---|---|---|
| CN | 113744629 | 12/2021 | | |
| JP | 4945682 | 6/2012 | | |
| KR | 102275190 | 7/2021 | | |
| TW | I758901 | 3/2022 | | |
| TW | 202223416 A | * | 6/2022 | ............. G09G 3/006 |

OTHER PUBLICATIONS

"Search Report of Europe Counterpart Application", issued on Mar. 7, 2023, p. 1-p. 7.

* cited by examiner

ELECTRONIC DEVICE INCLUDING CONDUCTIVE LAYER DISPOSED BETWEEN SUBSTRATE AND ELECTRONIC ELEMENT

CROSS-REFERENCE TO RELATED APPLICATION

This application claims the priority benefit of U.S. Provisional Application No. 63/270,560, filed on Oct. 21, 2021 and the priority benefit of China application serial no. 202210779816.3, filed on Jul. 4, 2022. The entirety of each of the above-mentioned patent applications is hereby incorporated by reference herein and made a part of this specification.

BACKGROUND

Technical Field

The disclosure relates to an electronic device.

Description of Related Art

In order to enable electronic components including in the electronic device to achieve various functions, such as rapid heat dissipation or reduction of electromagnetic interference, a conductive layer having a large area is generally formed in the electronic device; however, arrangement of the conductive layer will increase capacitive load of the electronic components and/or impedance of signal lines, or may cause terrain differences among various electronic components in the electronic device, which possibly makes the signal lines broken or peeled off. Therefore, how to reduce occurrence of the above problems and improve the reliability of the electronic device is one of the technologies developed in recent years.

SUMMARY

The disclosure provides an electronic device to solve the above problems encountered by existing electronic device, thereby improving the reliability of the electronic device.

According to an embodiment of the disclosure, the electronic device includes a substrate, a driving element, a conductive layer, and an electronic element. The driving element is disposed on the substrate. The conductive layer is disposed on the substrate, wherein there is a first distance (B) between the driving element and an edge of the conductive layer. The electronic element is disposed on the conductive layer and is electrically connected to the driving element, wherein there is a second distance (A) between the electronic element and the edge of the conductive layer, and the first distance (B) is greater than the second distance (A).

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
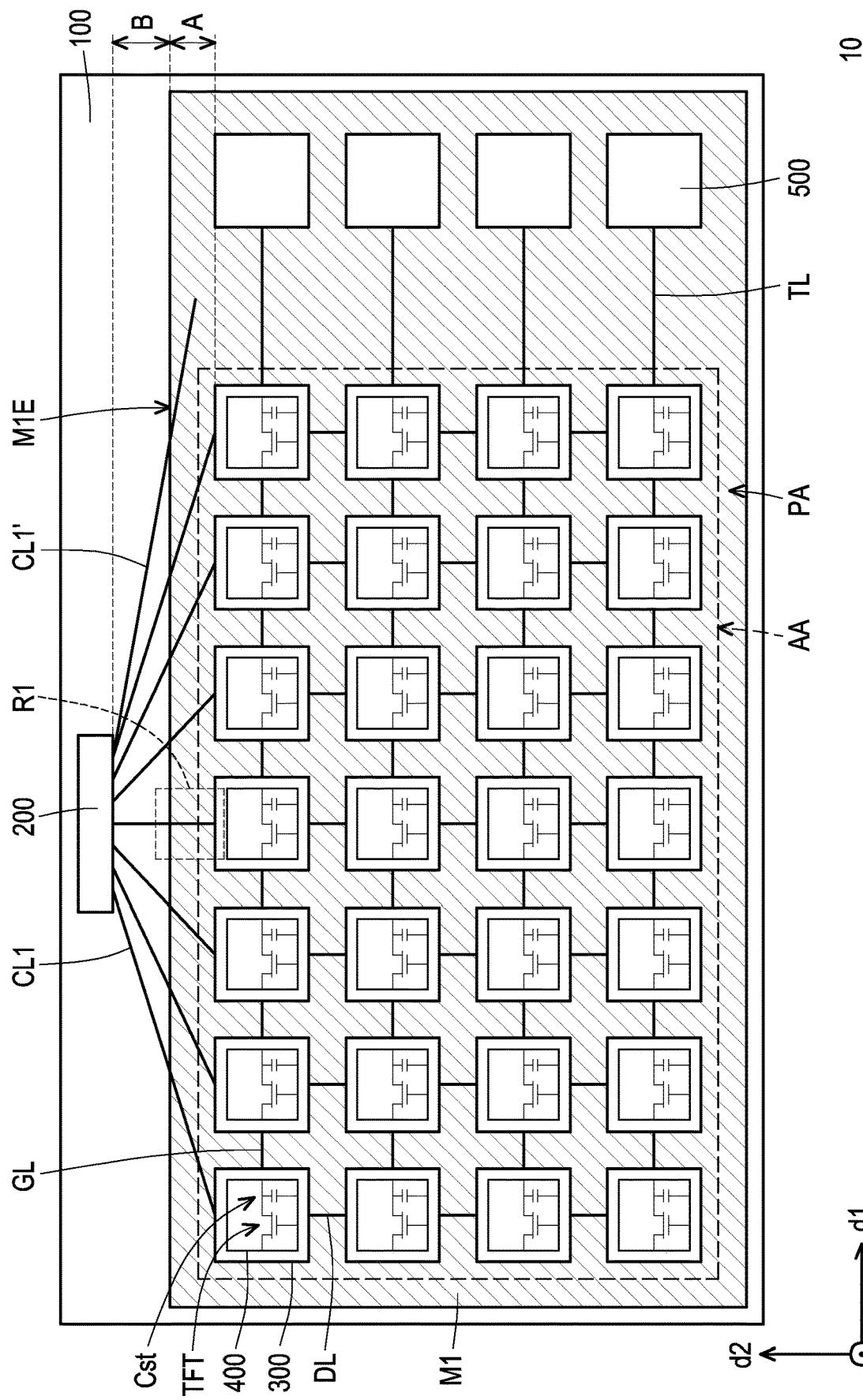
FIG. 1 is a schematic top view of an electronic device according to an embodiment of the disclosure.

The disclosure can be understood by referring to the following detailed description in conjunction with the drawings. It should be noted that in order to facilitate the understanding of the reader and the brevity of the drawings, multiple drawings in the disclosure only depict a part of an electronic device, and specific elements in the drawings are not drawn according to actual scale. In addition, the number and the size of each element in the drawings are for illustration only and are not intended to limit the scope of the disclosure.

Throughout the disclosure and the appended claims, certain terms may be used to refer to specific elements. It should be understood by persons skilled in the art that electronic device manufacturers may refer to the same element by different names. The disclosure does not intend to distinguish between elements with the same function but different names. In the following specification and claims, terms such as "including", "containing", and "having" are open-ended terms, so the terms should be interpreted as "containing but not limited to . . . ". Therefore, when the terms "including", "containing", and/or "having" are used in the description of the disclosure, the terms designate the presence of a corresponding feature, region, step, operation, and/or component, but do not exclude the presence of one or more corresponding features, regions, steps, operations, and/or components.

Directional terms, such as "upper", "lower", "front", "rear", "left", and "right", mentioned in the disclosure are only directions with reference to the drawings. Therefore, the used directional terms are used to illustrate, but not to limit, the disclosure. In the drawings, each drawing illustrates the general characteristics of a method, a structure, and/or a material used in a specific embodiment. However, the drawings should not be construed to define or limit the scope or nature covered by the embodiments. For example, for clarity, relative sizes, thicknesses, and positions of various film layers, regions, and/or structures may be reduced or enlarged.

When a corresponding component (such as a film layer or a region) is referred to as being "on another component", the component may be directly on the other component or there may be another component between the two. On the other hand, when a component is referred to as being "directly on another component", there is no component between the two. Also, when a component is referred to as being "on another component", the two have a top-down relationship in the top view direction, and the component may be above or below the other component, and the top-down relationship depends on the orientation of the device.

The terms "about", "substantially", or "roughly" are generally interpreted as within 20% of a given value or range or interpreted as within 10%, 5%, 3%, 2%, 1%, or 0.5% of the given value or range.

Terms such as "first" and "second" used in the specification and the claims are used to modify elements, and the terms do not imply and represent that the element(s) have any previous ordinal numbers, nor do they represent the order of a certain element and another element or the order of a manufacturing method. The use of the ordinal numbers is only used to clearly distinguish between an element with a certain name and another element with the same name. The claims and the specification may not use the same terms, whereby a first component in the specification may be a second component in the claims.

It should be noted that in the following embodiments, features in several different embodiments may be replaced, recombined, and mixed to complete other embodiments without departing from the spirit of the disclosure. As long as the features of the various embodiments do not violate the spirit of the invention or conflict with each other, the features can be mixed and matched arbitrarily.

Electrical connection described in the disclosure may refer to direct connection or indirect connection. In the case of direct connection, terminals of elements on two circuits are directly connected or connected to each other by a conductor segment.

In the disclosure, the measurement manner of thickness, length, and width may be by adopting an optical microscope, and the thickness may be measured by a cross-sectional image in an electron microscope, but not limited thereto. In addition, there may be a certain error in any two values or directions used for comparison. If a first value is equal to a second value, it implies that there may be an error of about 10% between the first value and the second value. If a first direction is perpendicular to a second direction, an angle between the first direction and the second direction may be between 80 degrees and 100 degrees; and if the first direction is parallel to the second direction, the angle between the first direction and the second direction may be between 0 degrees and 10 degrees.

The electronic device of the disclosure may include display, antenna, sensing, splicing, touch, other suitable functions, or a combination of the above functions, but not limited thereto. For example, the electronic device of the present disclosure may include active elements, passive elements, or combinations thereof, which may include diodes, transistors, capacitors, inductors, resistors, or combinations thereof, but the disclosure is not limited thereto. The electronic device includes a rollable electronic device, a bendable electronic device or a flexible electronic device, but not limited thereto. The electronic device may include, for example, liquid crystal, a light emitting diode (LED), a varactor diode, a quantum dot (QD), fluorescence, phosphor, other suitable materials, or a combination thereof. The light emitting diode may include, for example, an organic light emitting diode (OLED), a micro LED, a mini LED, or a QLED (or QDLED), but not limited thereto. The display device may be a self-luminous display device. The antenna device may be a liquid crystal antenna device or an antenna device without the liquid crystal. The sensing device may be a sensing device for sensing capacitance, light, heat or ultrasonic waves, but not limited thereto. The sensing device may include a fingerprint sensing device, a visible light sensing device, an infrared light sensing device, and an X-ray sensing device, but not limited thereto. The splicing device may be, for example, a splicing display device or a splicing antenna device, but not limited thereto. It should be noted that, the electronic device can be any arrangement and combination of the foregoing, but not limited to thereto. In addition, the shape of the electronic device may be rectangular, circular, polygonal, a shape with curved edges, or other suitable shapes. The electronic device may have peripheral systems, such as a processing system, a driving system, a control system, a light source system, a shelf system and so on, to support a display device or a splicing device. It should be noted that, the electronic device can be any arrangement and combination of the foregoing, but not limited to this. Hereinafter, the disclosure will be described by taking a display device or a splicing device as the electronic device, but the disclosure is not limited thereto.

Exemplary embodiments of the disclosure are exemplified below, and the same reference numerals are used in the drawings and description to refer to the same or similar parts.

Figure 2A:
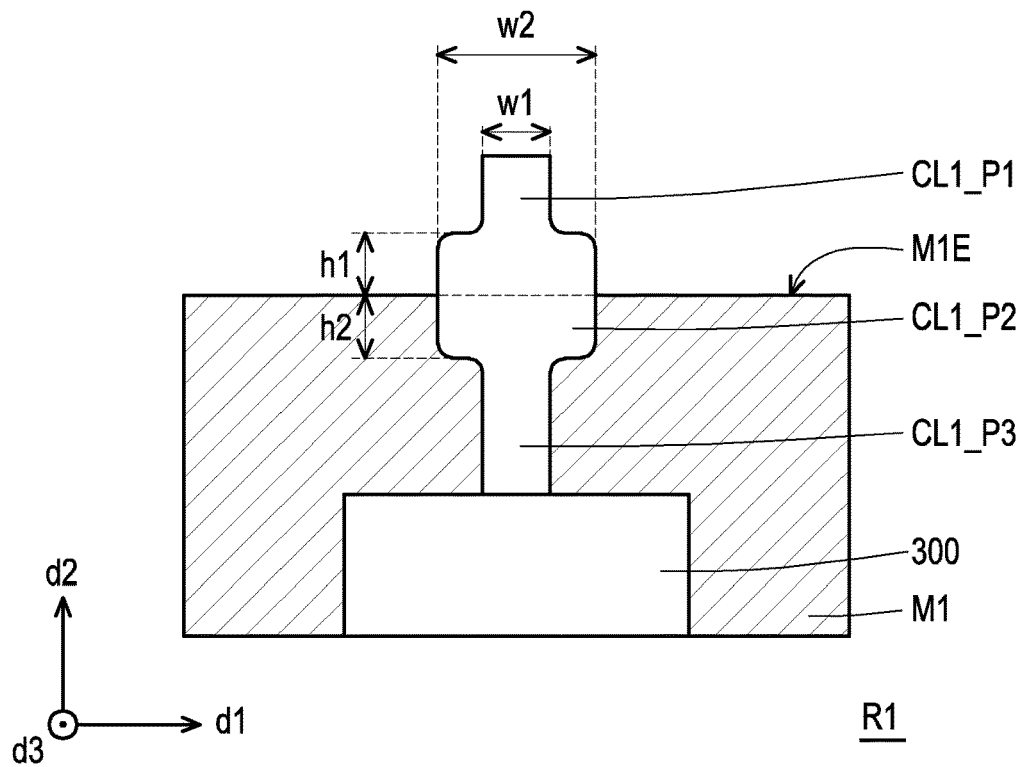
FIG. 2A is an enlarged schematic diagram according to an embodiment of a region R1 of FIG. 1.
Figure 2B:
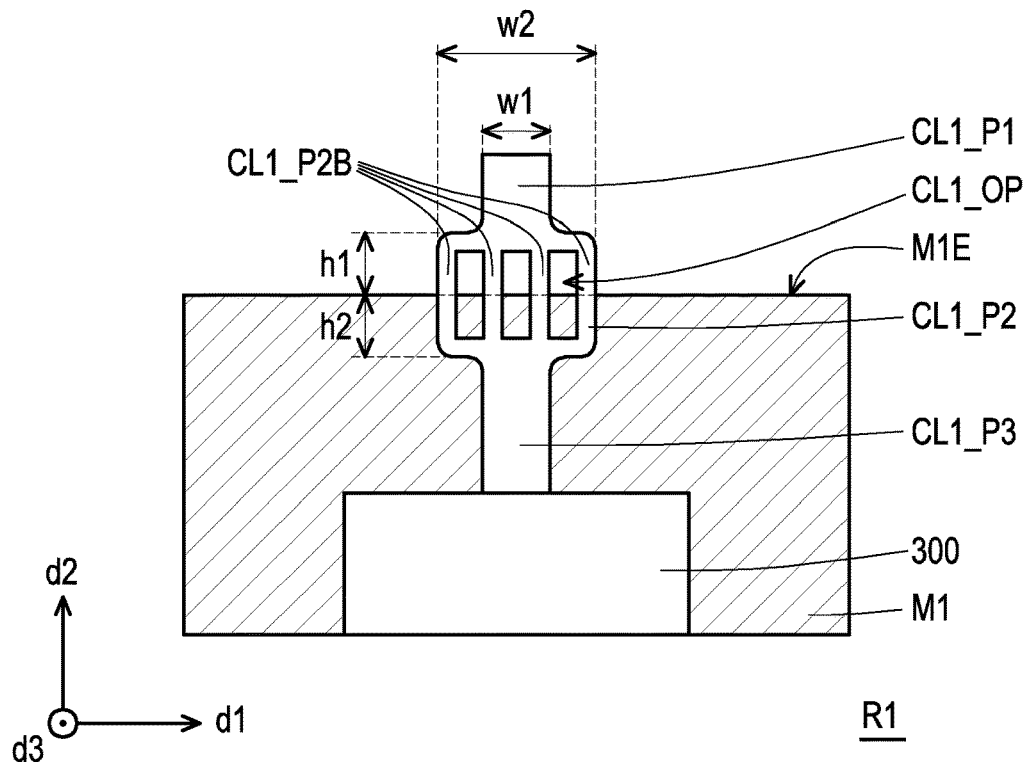
FIG. 2B is an enlarged schematic diagram according to another embodiment of the region R1 of FIG. 1.
Figure 2C:
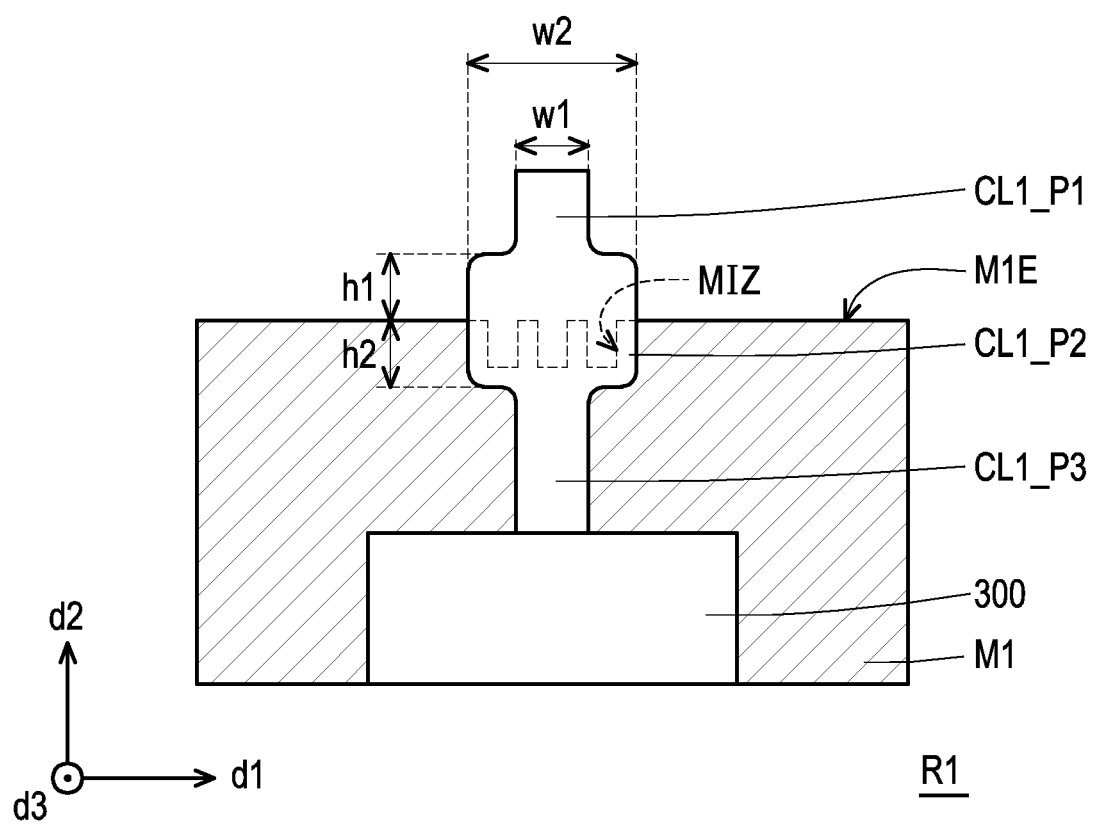
FIG. 2C is an enlarged schematic diagram according to yet another embodiment of the region R1 of FIG. 1.
Figure 3A:
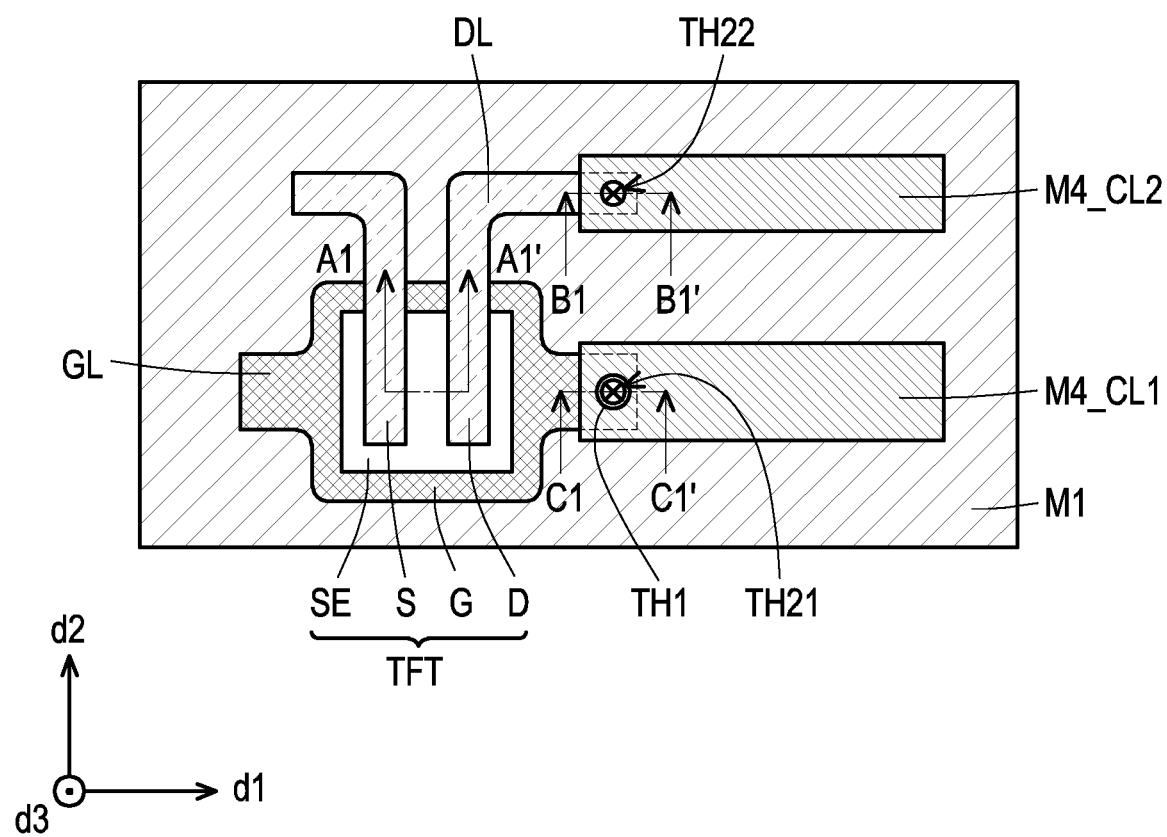
FIG. 3A is an enlarged schematic diagram according to an embodiment of FIG. 1.
Figure 3B:
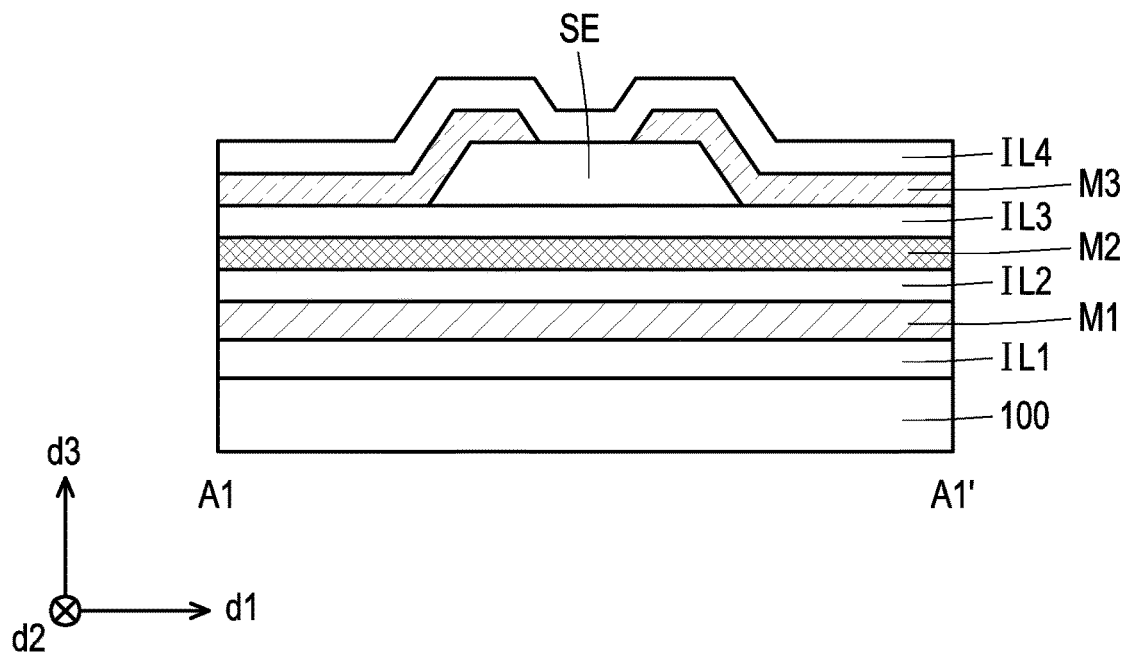
FIG. 3B is a partial schematic cross-sectional view of an embodiment according to a section line A1-A1' of FIG. 3A.
Figure 3C:
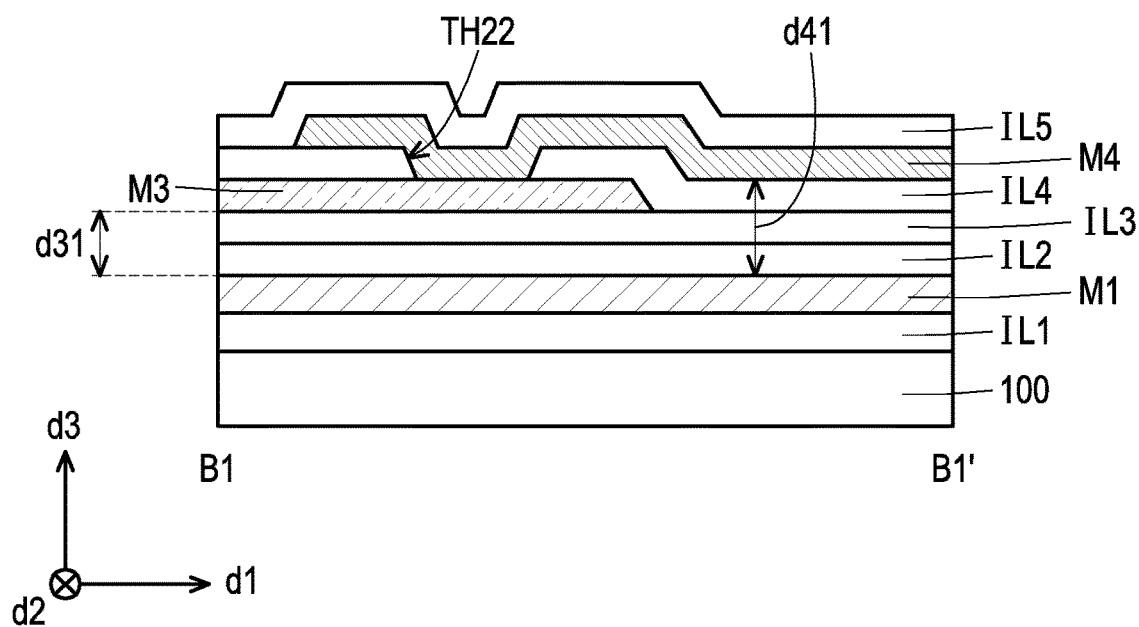
FIG. 3C is a partial schematic cross-sectional view of an embodiment according to a section line B1-B1' of FIG. 3A.
Figure 3D:
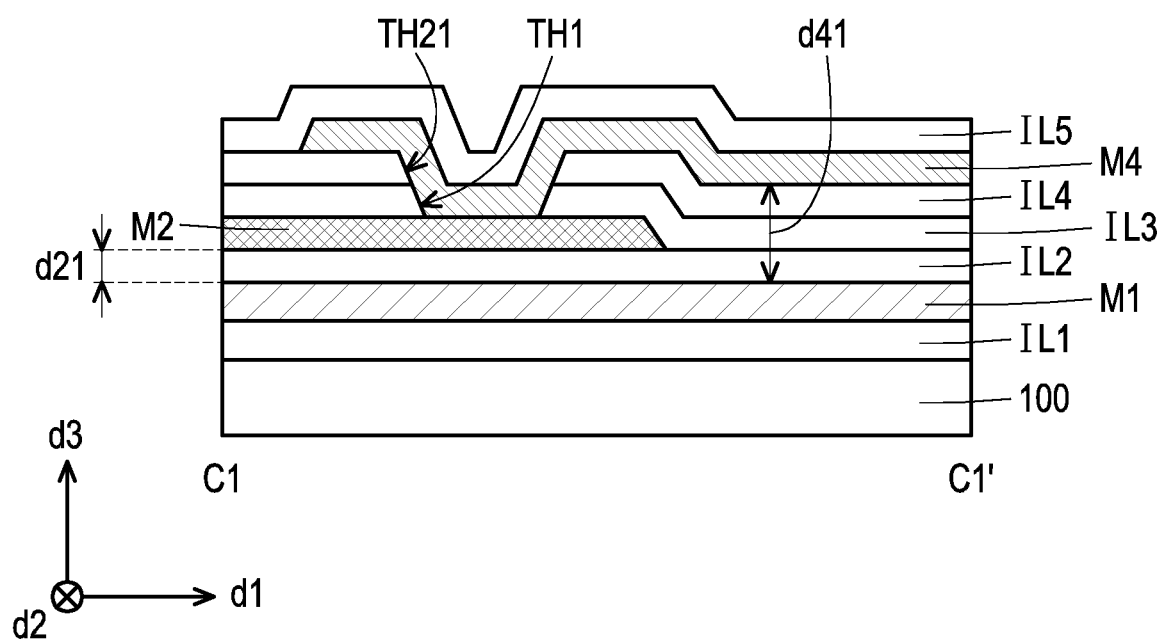
FIG. 3D is a partial schematic cross-sectional view of an embodiment according to a section line C1-C1' of FIG. 3A.

FIG. 1 is a schematic top view of an electronic device according to an embodiment of the disclosure, FIG. 2A is an enlarged schematic diagram according to an embodiment of a region R1 of FIG. 1, FIG. 2B is an enlarged schematic diagram according to another embodiment of the region R1 of FIG. 1, FIG. 2C is an enlarged schematic diagram according to yet another embodiment of the region R1 of FIG. 1, and FIG. 3A is an enlarged schematic diagram according to an embodiment of FIG. 1. It should be noted that some elements are omitted in FIG. 1 and FIG. 3A for the sake of clarity and convenience in the description of the drawings.

Referring to FIG. 1, FIG. 2A, FIG. 2B and FIG. 2C, an electronic device 10 of the present embodiment includes an active area AA and a peripheral area PA. In some embodiments, the peripheral area PA is located at least one side of the active area AA. In the present embodiment, the peripheral area PA surrounds the active area AA, but the disclosure is not limited thereto. The electronic device 10 of the present application may be, for example, a display device, an antenna device, a sensing device, or a splicing device. In the present embodiment, the electronic device 10 includes a substrate 100, a driving element 200, a conductive layer M1 and an electronic element 300.

A material of the substrate 100 can be glass, plastic or a combination thereof. For example, the material of the substrate 100 may include quartz, sapphire, polymethyl methacrylate (PMMA), polycarbonate (PC), polyimide (PI), polyethylene terephthalate (PET) or other suitable materials or a combination of the above materials, the disclosure is not limited thereto.

The driving element 200 is disposed on the substrate 100 and is located in the peripheral area PA of the electronic device 10. In some embodiments, the driving element 200 is disposed on a surface of the substrate 100 like a chip on glass (COG), but the present disclosure is not limited thereto. Namely, in other embodiments, the driving element 200 may be disposed on the surface of the substrate 100 like a chip on plastic (COP). Alternatively, in another embodiments, the driving element 200 includes a driving circuit and is directly disposed on the surface of the substrate 100 like a gate on panel (GOP). It should be noted that although only one driving element 200 shown in FIG. 1, the disclosure is not limited thereto. In other embodiments, the electronic device 10 may include more than two driving elements 200 disposed on the surface of the substrate 100. The driver element 200 may include a driver chip, a circuit board, or a combination thereof. In some embodiments, the driving chip may include driving units, such as a timing control unit, a data driving unit, and a power driving unit, and the circuit board may include a flexible printed circuit board (FPC), but the disclosure is not limited thereto.

The conductive layer M1 is disposed on the substrate 100, and is located in the active area AA of the electronic device 10. In some embodiments, the conductive layer M1 is not only disposed in the active area AA, but also extends to the peripheral area PA, and the conductive layer M1 could be used as a heat dissipation layer, an electrostatic discharge protection layer, an electromagnetic interference shielding layer of the electronic device 10, but the disclosure is not limited thereto. A material of the conductive layer M1 may include low resistivity material, such as silver, copper, gold, aluminum, tin, nickel or a combination thereof. However, the material of the conductive layer M1 can also be other suitable materials or a combination of the above materials, the disclosure is not limited thereto. In the present embodiment, the conductive layer M1 has an edge M1E adjacent to the driving element 200. For example, the edge M1E of the conductive layer M1 substantially extends along a first direction d1, but the disclosure is not limited thereto. In addition, the conductive layer M1 is a quadrilateral, but the disclosure is not limited thereto. Namely, in other embodiments, the conductive layer M1 may not be quadrilateral. In the present disclosure, "A is adjacent to B" means that there is no A or B between A and B, but other elements may be disposed between A and B.

The electronic element 300 is disposed on the conductive layer M1. In some embodiments, a plurality of the electronic elements 300 are disposed on the conductive layer M1 at intervals. For example, as shown in FIG. 1, the plurality of electronic elements 300 are disposed on the conductive layer M1 in an array, but the disclosure is not limited thereto. In other embodiments, the plurality of electronic elements 300 may be disposed on the conductive layer M1 in a staggered arrangement (for example, a pentile layout) or other arrangement. The electronic element 300 may include a variable capacitor, a light-emitting diode, a solar cell, and so on, but the disclosure is not limited thereto.

In the present embodiment, the electronic element 300 adjacent to the edge M1E of the conductive layer M1 is electrically connected to the driving element 200 through a first conductive line CL1, so the electronic element 300 could be driven by the driving element 200. There is a first distance B between the driving element 200 adjacent to the edge M1E of the conductive layer M1 and the edge M1E of the conductive layer M1, and there is also a second distance A between the electronic element 300 and the edge M1E of the conductive layer M1. In detail, there is the first distance B between the driving element 200 and the edge M1E of the conductive layer M1 in an extending direction of the first conductive line CL1 (for example, a second direction d2), and there is the second distance A between the electronic element 300 and the edge M1E of the conductive layer M1 in the extending direction of the first conductive line CL1 (for example, the second direction d2), wherein the second direction d2 is different from the first direction d1 (for example, the second direction d2 and the first direction d1 are orthogonal). In some embodiments, the first distance B is greater than the second distance A. Alternatively, the first distance B and the second distance A satisfy the following relationship: B>A. When the first distance B and the second distance A satisfy the above relationship, an overlapping area of the conductive layer M1 and the first conductive line CL1 can be reduced, so that capacitive load of the electronic device 10 can be reduced, thereby improving signal transmission quality of the electronic device 10. In other embodiments, the first distance B and the second distance A may satisfy the following relationship: B/(A+B)≥50%. It should be noted that when the first distance B and the second distance A satisfy the above relationship, the above effects can be achieved at any position in the electronic device 10.

Referring to FIG. 1 and FIG. 3A, in the present embodiment, the electronic device 10 further includes an electrical element 400. In some embodiments, the electrical element 400 partially overlaps the electronic element 300 in a third direction d3 (a normal direction of the substrate 100, which is orthogonal to the second direction d2 and the first direction d1) at least, but the disclosure is not limited thereto. The electrical element 400 may include a thin film transistor TFT and a storage capacitance Cst that are electrically connected to each other, but the disclosure is not limited thereto. In some embodiments, the thin film transistor TFT is electrically connected to the electronic element 300 to serve as a switching element for driving the electronic element 300. The thin film transistor TFT may include a plurality of electrodes and a semiconductor layer SE. For example, in the present embodiment, the plurality of electrodes include a gate G, a source S, and a drain D, but the disclosure is not limited thereto. In some embodiments, a material of the semiconductor layer SE includes low temperature polysilicon (LTPS), low temperature polysilicon oxide (LTPO) or amorphous silicon (a-Si), but the disclosure is not limited thereto. For example, the material of the semiconductor layer SE may include amorphous silicon, polysilicon, germanium, compound semiconductors (such as gallium nitride, silicon carbide, gallium arsenide, gallium phosphide, indium phosphide, indium arsenide and/or or indium antimonide), alloy semiconductors (such as SiGe alloy, GaAsP alloy, AlInAs alloy, AlGaAs alloy, GaInAs alloy, GaInP alloy, GaInAsP alloy), or a combination of thereof, but the disclosure is not limited thereto. The material of the semiconductor layer SE may also include metal oxides, such as indium gallium zinc oxide (IGZO), indium zinc oxide (IZO), indium gallium zinc oxide (IGZTO), an organic semiconductors including polycyclic aromatic compounds, or a combination of thereof, but the disclosure is not limited thereto. The gate G partially overlaps the semiconductor layer SE in the third direction d3 of the substrate 100 at least. The source S and the drain D are separated from each other and cover a portion of the semiconductor layer SE at least, and are electrically connected to the semiconductor layer SE, wherein the drain D can be electrically connected to the storage capacitance Cst. Alternatively, the source S and the drain D could be electrically connected to the semiconductor layer SE through a via hole in an insulating layer located between thereof. The thin film transistor TFT could be any bottom-gate-type thin film transistor known to those skilled in the related art, but the disclosure is not limited thereto.

In the present embodiment, the electronic device 10 further includes a test pad 500. For example, the test pad 500 is located in the peripheral area PA of the electronic device 10, and is disposed on a side of the active area AA different from that of the driving element 200, but the disclosure is not limited thereto. In some embodiments, the test pad 500 may overlap the conductive layer M1, but the disclosure is not limited thereto. In other embodiments, the test pad 500 may not overlap the conductive layer M1. In some embodiments, a plurality of the test pads 500 are provided, and the plurality of test pads 500 are arranged along the second direction d2, but the disclosure is not limited thereto. In the present embodiment, the test pad 500 and the electronic element 300 are electrically connected to each other through a test connection line TL. Therefore, the test pad 500 can be used to test whether the plurality of electronic elements 300 are damaged during the process of forming the electronic device 10, and the damaged electronic element 300 could be repaired or be replaced with new electronic element. The above method for testing could be observing electrical characteristics of the electronic element 300 to determine whether the electronic element 300 is damaged by applying a bias voltage to the test pad 500 via a test device (not shown); or detecting thermal characteristics of the electronic element 300 to determine whether the electronic element 300 is damaged via a thermal imager, but the disclosure is not limited thereto.

In the present embodiment, the electronic device 10 further includes the first conductive line CL1. For example, the first conductive line CL1 is electrically connected to the driving element 200 and the electronic element 300 for transmitting the signal from the driving element 200 to the corresponding electrical element 400 (for example, the thin film transistor TFT) to drive the electronic element 300, but the disclosure is not limited thereto. In other embodiments, the driving element 200 can also directly transmit the signal to the electronic element 300 through other conductive lines. Based on the above, the first conductive line CL1 could extend from the driving element 200 located in the peripheral area PA to the electrical element 400 located in the active area AA, so that the first conductive line CL1 includes a portion located outside the conductive layer M1 and not overlapping the conductive layer M1 and the other portion overlapping the conductive layer M1 (wherein a boundary line is the edge M1E of the conductive layer M1). In order to reduce the occurrence of disconnection or peeling of the first conductive line L1 at the edge M1E of the conductive layer M1 due to terrain differences when the first conductive line CL1 extends to the edge M1E of the conductive layer M1 and crosses the conductive layer M1, the present embodiment provides the first conductive line CL1 including a portion having a relatively large width located at the edge M1E of the conductive layer M1. In detail, as shown in FIG. 2A, the first conductive line CL1 located outside the conductive layer M1 (the first conductive line CL1 not overlapping the conductive layer M1) has a first width w1 along the first direction d1, and the first conductive line CL1 located on the edge M1E of the conductive layer M1 has a second width w2 along the first direction d1, wherein the first width w1 is smaller than the second width w2. In some embodiments, the first width w1 and the second width w2 satisfy the following relationship: w2≥w1*1.1. Based on the above, in the present embodiment, occurrence of the above problems can be reduced and reliability of the electronic device 10 can be improved via making the first width w1 smaller than the second width w2. In the present embodiment, the electronic device 10 further includes a first lead CL1'. The first conductive line CL1' extends from the driving element 200 to the conductive layer M1 and is used to electrically connect the driving element 200 and the conductive layer M1, but the disclosure is not limited thereto.

The first conductive line CL1 includes a portion CL1_P1 having a first width w1 and a portion CL1_P2 having a second width w2 from another perspective, wherein the portion CL1_P2 of the first conductive line CL1 extends from a location outside the conductive layer M1 to the conductive layer M1. In some embodiments, an edge of the portion CL1_P2 of the first conductive line CL1 is arc-shaped, which can reduce the chance of static electricity accumulating to the edge, so as to realize the electrical static discharge protection. The portion CL1_P2 of the first conductive line CL1 partially overlaps the edge M1E of the conductive layer M1, wherein the portion CL1_P2 not overlapping the conductive layer M1 has a length h1 along the second direction d2, and the portion CL1_P2 overlapping the conductive layer M1 has a length h2 along the second direction d2, and the length h1 and the length h2 could be 1 μm to 50 μm, but the disclosure is not limited thereto. The length h1 and the length h2 may be the same or different, for example, the length h1 may be greater than the length h2, but the disclosure is not limited thereto. In some embodiments, the first conductive line CL1 further includes a portion CL1_P3 extending from the portion CL1_P2 to the electronic element 300. A width of the portion CL1_P3 of the first conductive line CL1 may be substantially the same as that of the portion CL1_P1; or substantially the same as that of the portion CL1_P2; or greater than that of the portion CL1_P2, the disclosure is not limited thereto.

In other embodiments, as shown in FIG. 2B, the portion CL1_P2 of the first conductive line CL1 has a plurality of openings CL1_OP located along the first direction d1 at intervals, so that the portion CL1_P2 of the first conductive line CL1 has a plurality of branch portions CL1_P2B. The plurality of branch portions CL1_P2B of the first conductive line CL1 are also extend from a location outside the conductive layer M1 to the conductive layer M1. Therefore, when some branch portions CL1_P2B included in the portion CL1_P2 of the first conductive line CL1 are disconnected, the electronic device 10 can still transmit signals through the unbroken branch portion CL1_P2B of the first conductive line CL1, thereby improving the reliability of the electronic device 10.

In yet another embodiments, as shown in FIG. 2C, the edge M1E of the conductive layer M1 includes a non-linear portion M1Z, and the first conductive line CL1 is located on the non-linear portion M1Z. In some embodiments, the non-linear portion M1Z of the conductive layer M1 may include a zigzag shape (as shown in FIG. 2C), a wave shape, an arc shape, or a combination thereof, but the disclosure is not limited thereto. Therefore, a length of overlapping portion of the first conductive line CL1 and the edge M1E of the conductive layer M1 can be increased, so as to reduce occurrence of disconnection or peeling of the first conductive line CL1 at the edge M1E of the conductive layer M1, thereby improving the reliability of the electronic device 10.

In the present embodiment, as shown in FIGS. 3A to 3D, the electronic device 10 further includes an insulating layer ILL an insulating layer IL2, a conductive layer M2, an insulating layer IL3, a conductive layer M3, an insulating layer IL4, a conductive layer M4 and an insulating layer IL5, wherein the embodiments shown in FIGS. 3A to 3D correspond to region(s) where the thin film transistor TFT is provided.

The insulating layer IL1 is disposed on the substrate 100. In the present embodiment, the insulating layer IL1 is disposed between the substrate 100 and the conductive layer M1. A material of the insulating layer IL1 can be inorganic materials (for example, silicon oxide, silicon nitride, silicon oxynitride, or a stacked layer of at least two of the above-mentioned materials), organic materials (for example, polyimide resins, epoxy resins or acrylic resin) or a combination thereof, but the disclosure is not limited thereto.

The insulating layer IL2 is disposed on the insulating layer IL1. In the present embodiment, the insulating layer IL2 covers the conductive layer M1. A material of the insulating layer IL2 can be inorganic materials (for example, silicon oxide, silicon nitride, silicon oxynitride, or a stacked layer of at least two of the above-mentioned materials), organic materials (for example, polyimide resins, epoxy resins or acrylic resin) or a combination thereof, but the disclosure is not limited thereto.

The conductive layer M2 is disposed on the insulating layer IL2. In the present embodiment, the conductive layer M2 is formed with the gate G and a gate line GL, wherein the gate G can be electrically connected to the corresponding gate line GL to receive the corresponding gate signal, but the disclosure is not limited thereto. The conductive layer M2 and the conductive layer M1 may include the same or different materials, and the disclosure is not limited thereto.

The insulating layer IL3 is disposed on the insulating layer IL2. In the present embodiment, the insulating layer IL3 partially covers the conductive layer M2. Namely, the insulating layer IL3 has a through hole TH1 exposing a portion of the conductive layer M2, but the disclosure is not limited thereto. The insulating layer IL3 is disposed between the gate G and the semiconductor layer SE to serve as a gate insulating layer from another perspective. A material of the insulating layer IL3 can be inorganic materials (for example, silicon oxide, silicon nitride, silicon oxynitride, or a stacked layer of at least two of the above-mentioned materials), organic materials (for example, polyimide resins, epoxy resins or acrylic resin) or a combination thereof, but the disclosure is not limited thereto.

The conductive layer M3 is disposed on the insulating layer IL3, and partially covers the semiconductor layer SE which is also disposed on the insulating layer IL3. In the present embodiment, the conductive layer M3 is formed with the source S, the drain D and a data line DL, wherein the drain D can be electrically connected to the corresponding data line DL to receive the corresponding data signal, but the disclosure is not limited thereto. The conductive layer M3 and the conductive layer M1 may include the same or different materials, and the disclosure is not limited thereto.

The insulating layer IL4 is disposed on the insulating layer IL3. In the present embodiment, the insulating layer IL4 partially covers the conductive layer M3. Namely, the insulating layer IL4 has a through hole TH22 exposing a portion of the conductive layer M3, but the disclosure is not limited thereto. In addition, the insulating layer IL4 further includes a through hole TH21 exposing a portion of the conductive layer M2. In detail, in the present embodiment, the through hole TH21 overlaps the through hole TH1, so that the insulating layer IL4 and the insulating layer IL3 expose the portion of the conductive layer M2 together. In some embodiments, the insulating layer IL4 exposes the gate line GL of the conductive layer M2 and the data line DL of the conductive layer M3. A material of the insulating layer IL4 can be inorganic materials (for example, silicon oxide, silicon nitride, silicon oxynitride, or a stacked layer of at least two of the above-mentioned materials), organic materials (for example, polyimide resins, epoxy resins or acrylic resin) or a combination thereof, but the disclosure is not limited thereto.

The conductive layer M4 is disposed on the insulating layer IL4. In the present embodiment, the conductive layer M4 is formed with a conductive line M4_CL1 and a conductive line M4_CL2, wherein the conductive line M4_CL1 is electrically connected to the corresponding gate line GL, and the conductive line M4_CL2 is electrically connected to the corresponding data line DL. In detail, the conductive line M4_CL1 is electrically connected to the gate line GL of the conductive layer M2 through the through hole TH21 and the through hole TH1 connected to each other, and the conductive line M4_CL2 is electrically connected to the data line DL of the conductive layer M3 through the through hole TH22, so that the conductive line M4_CL1 and the conductive line M4_CL2 are respectively used as transition lines for the gate line GL and the data line DL. Based on the above, since the conductive layer M4 is disposed farther from the conductive layer M1 compared to the conductive layer M2 (or compared to the conductive layer M3), the gate line GL (or the data line DL) for transmitting signals are electrically connected to the conductive layer M4, thereby increasing a distance between the gate line GL (or the data line DL) and the conductive layer M1, and impedance of the gate line GL (or impedance of the data line DL) could be reduced. In detail, in the normal direction of the substrate 100 (the third direction d3), a distance d41 between the conductive layer M4 and the conductive layer M1 is greater than a distance d31 between the conductive layer M3 and the conductive layer M1, and the distance d41 between the conductive layer M4 and the conductive layer M1 is also greater than a distance d21 between the conductive layer M2 and the conductive layer M1. In the normal direction of the substrate 100 (the third direction d3) from another perspective, the distance d41 between the conductive line M4_CL2 and the conductive layer M1 is greater than the distance d31 between the drain D and the conductive layer M1, and the distance d41 between the conductive line M4_CL1 and the conductive layer M1 is also greater than the distance d21 between the conductive layer M2 (for example, the gate G or the gate line GL) and the conductive layer M1.

Figure 4A:
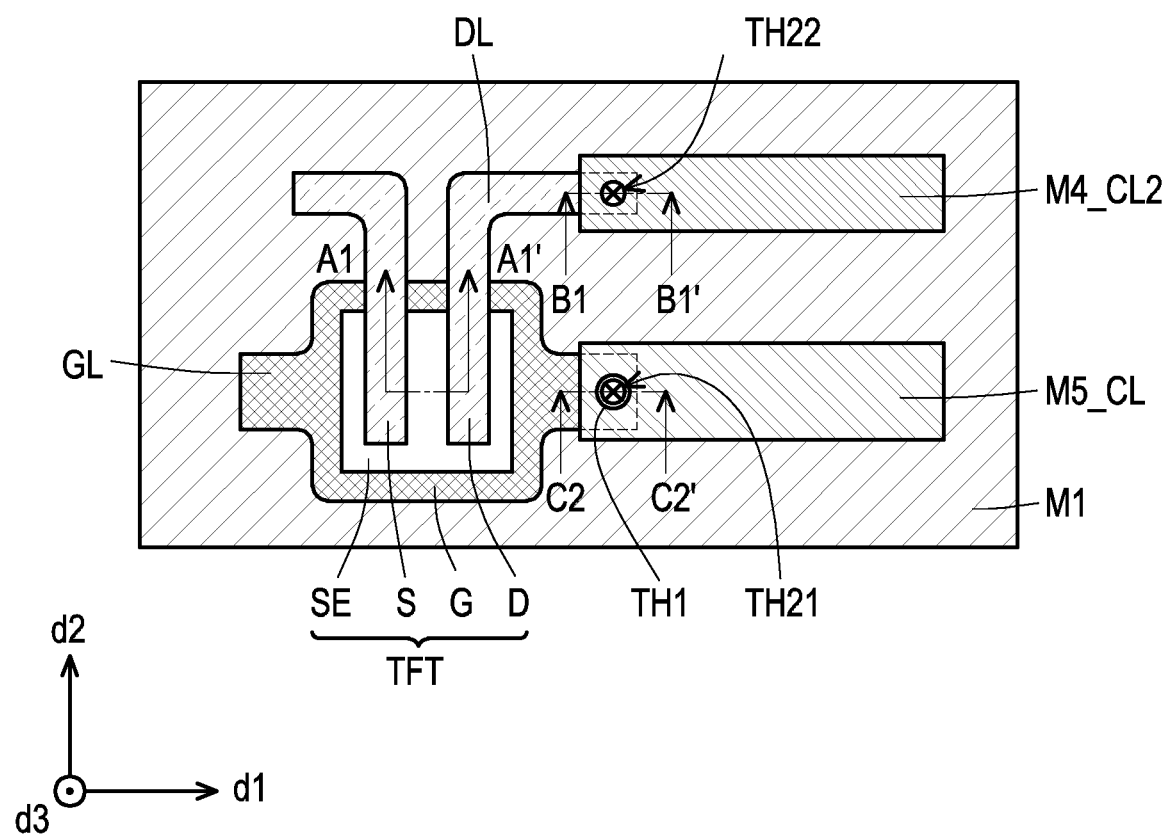
FIG. 4A is an enlarged schematic diagram according to another embodiment of FIG. 1.
Figure 4B:
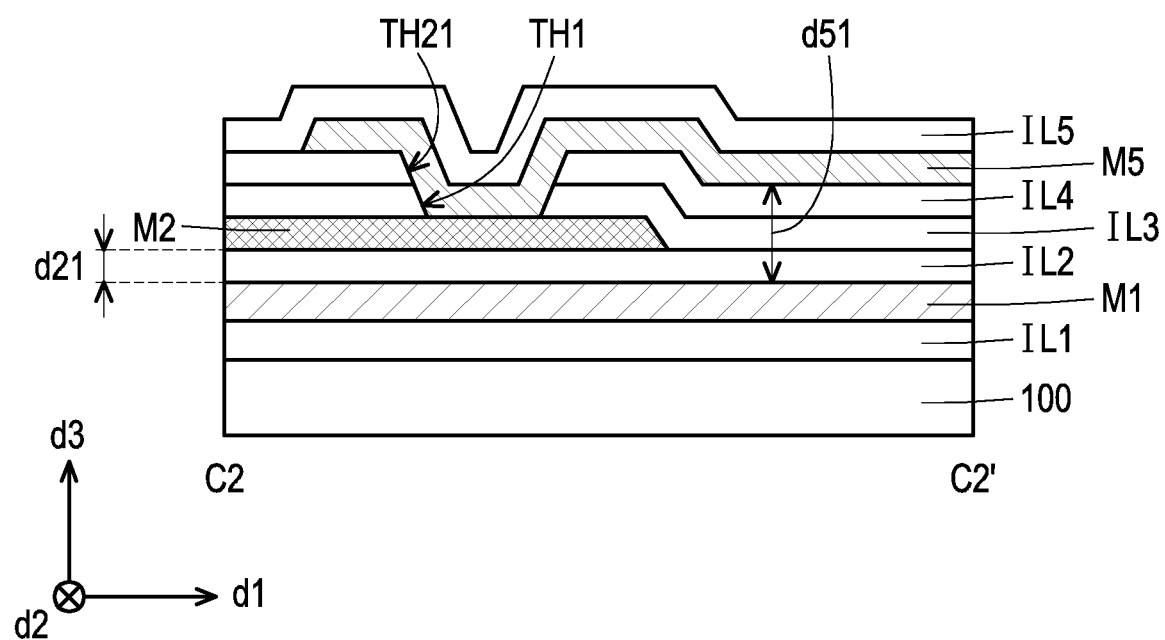
FIG. 4B is a partial schematic cross-sectional view of an embodiment according to a section line C2-C2' of FIG. 4A.

FIG. 4A is an enlarged schematic diagram according to another embodiment of FIG. 1, and FIG. 4B is a partial schematic cross-sectional view of an embodiment according to a section line C2-C2' of FIG. 4A. It should be noted that the embodiments of FIG. 4A and FIG. 4B can respectively use the reference marks and part of the technical contents of the embodiments of FIG. 3A and FIG. 3D, wherein the same or similar reference marks are used to represent the same or similar elements, and description of technical content pertaining the same technology is omitted.

Referring to FIG. 4A and FIG. 4B, a main difference between the present embodiment and the preceding embodiment is that further including a conductive layer M5. The conductive layer M5 is used to replace the conductive line M4_CL1 formed by the conductive layer M4 and is electrically connected to the corresponding gate line GL.

In detail, the conductive layer M5 is also disposed on the insulating layer IL4, wherein the conductive layer M5 is disposed on the insulating layer IL4 by performing a process different from that of forming the conductive layer M4, but the disclosure is not limited thereto. In the present embodiment, the conductive layer M5 is formed with a conductive line M5_CL, and the conductive line M5_CL is electrically connected to the gate line GL of the conductive layer M2 through the through hole TH21 and the through hole TH1 connected to each other. Therefore, since the conductive layer M5 is disposed farther from the conductive layer M1 compared to the conductive layer M2, the gate line GL for transmitting signals are electrically connected to the conductive layer M5, thereby increasing a distance between the gate line GL and the conductive layer M1, and impedance of the gate line GL could be reduced. In detail, in the normal direction of the substrate 100 (the third direction d3), a distance d51 between the conductive layer M5 and the conductive layer M1 is greater than the distance d21 between the conductive layer M2 and the conductive layer M1. In the normal direction of the substrate 100 (the third direction d3) from another perspective, the distance d51 between the conductive line M5_CL and the conductive layer M1 is greater than the distance d21 between the conductive layer M2 (for example, the gate G or the gate line GL) and the conductive layer M1.

It should be noted that although the conductive layer M5 and the conductive layer M4 in the present embodiment are located on the same level, the disclosure is not limited thereto. In other embodiments, the electronic device 10 may further include an insulating layer (not shown) covering the conductive layer M4, and the conductive layer M5 is disposed on the insulating layer, so that the conductive layer M5 and the conductive layer M4 belong to different layers. The conductive line M5_CL and the conductive line M4_CL1 belong to different layers from another perspective. The insulating layer also includes a through hole (not shown) connected with the through hole TH21 and the through hole TH1 to expose the portion of the conductive layer M2, and the conductive line M5_CL of the conductive layer M5 is electrically connected to the gate line GL of the conductive layer M2 via the through hole. Since the conductive layer M5 and the conductive layer M4 are located at the different level in present embodiment, the adverse effect caused by the signal coupling between the gate line GL and the data line DL can be reduced, thereby improving the signal transmission quality of the electronic device 10.

Figure 5A:
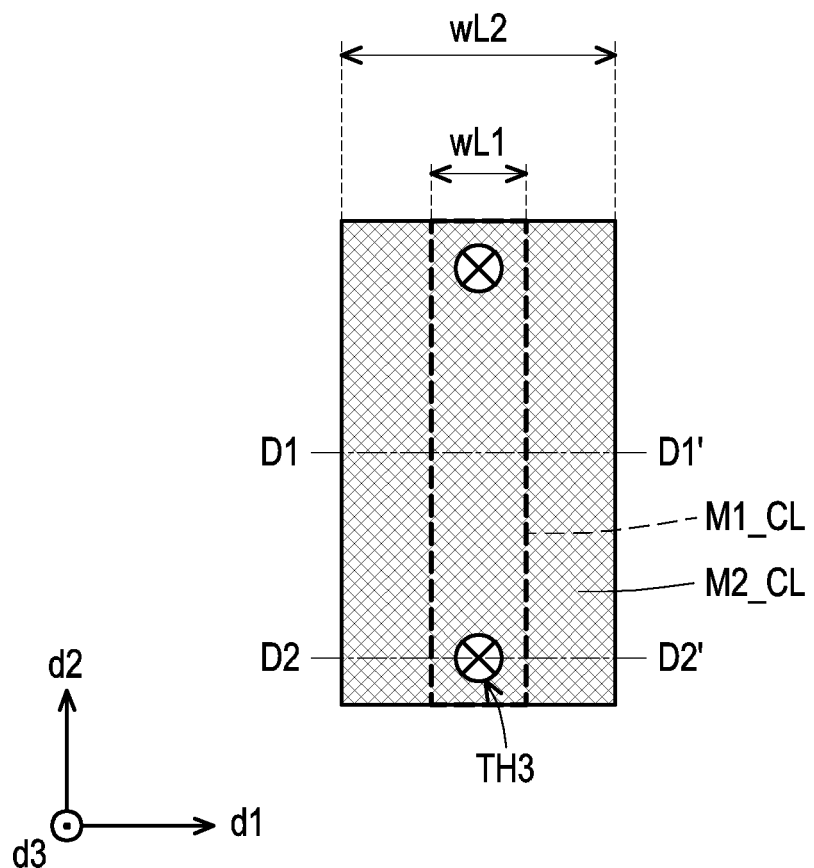
FIG. 5A is a partial schematic top view of arrangement among conductive layers of an electronic device according to an embodiment.
Figure 5B:
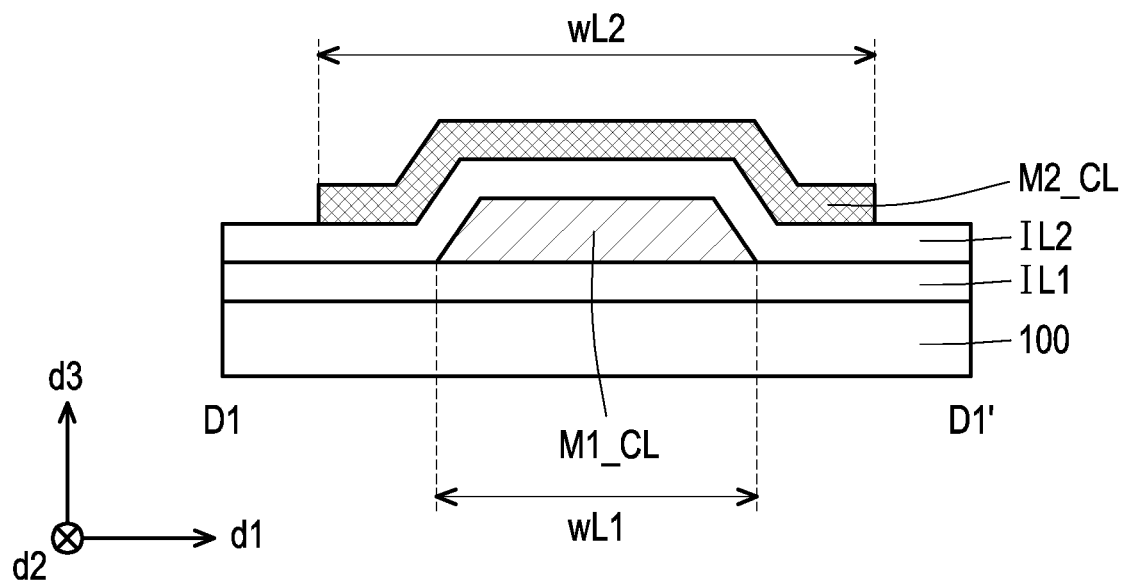
FIG. 5B is a partial schematic cross-sectional view of an embodiment according to a section line D1-D1' of FIG. 5A.
Figure 5C:
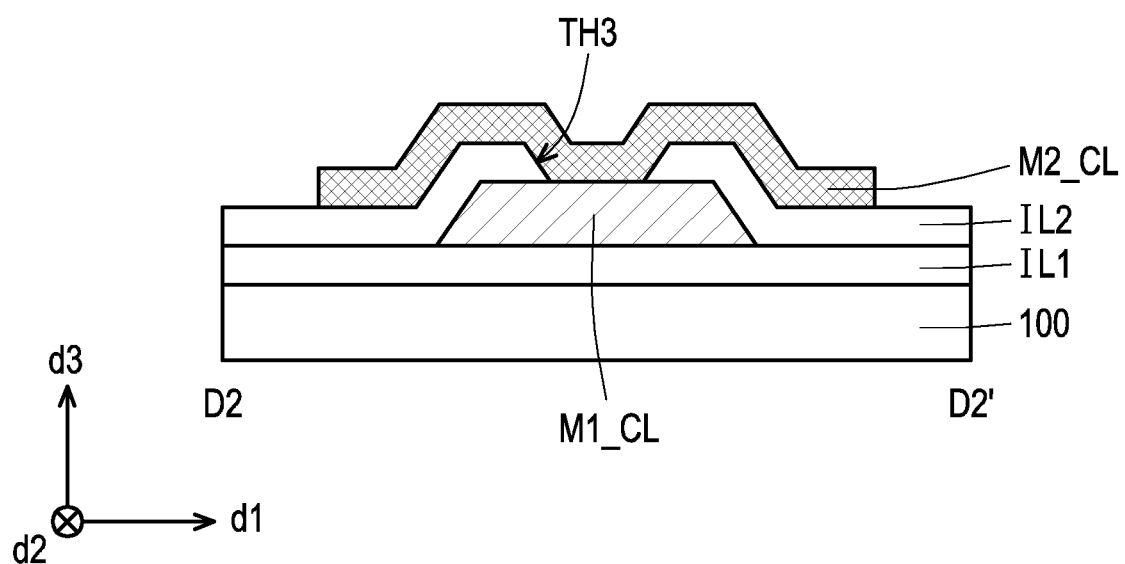
FIG. 5C is a partial schematic cross-sectional view of an embodiment according to a section line D2-D2' of FIG. 5A.

FIG. 5A is a partial schematic top view of arrangement among conductive layers of an electronic device according to an embodiment, FIG. 5B is a partial schematic cross-sectional view of an embodiment according to a section line D1-D1' of FIG. 5A, and FIG. 5C is a partial schematic cross-sectional view of an embodiment according to a section line D2-D2' of FIG. 5A. It should be noted that the embodiments of FIGS. 5A to 5C can respectively use the reference marks and part of the technical contents of the embodiments of FIGS. 3A to 3D, wherein the same or similar reference marks are used to represent the same or similar elements, and description of technical content pertaining the same technology is omitted.

Referring to FIGS. 5A to 5C, in some embodiments, the conductive layer M1 of the electronic device 10 is formed with a conductive line M1_CL, the conductive layer M2 is formed with a conductive line M2_CL, and the insulating layer IL2 has a through hole TH3, wherein the through hole TH3 exposes a portion of the conductive line M1_CL. The conductive line M1_CL is disposed on the substrate 100, and the conductive line M2_CL overlaps the conductive line M1_CL, wherein the conductive line M2_CL and the conductive line M1_CL extend along the same direction. For example, the conductive line M2_CL and the conductive line M1_CL may extend along the second direction d2, but the disclosure is not limited thereto. In the present embodiment, the conductive line M2_CL is electrically connected to the conductive line M1_CL through the through hole TH3 of the insulating layer IL2. The impedance of the conductive line M2_CL can be reduced through stacking the conductive line M2_CL with the conductive line M1_CL in parallel, thereby improving the signal transmission quality of the electronic device 10. In addition, in the present embodiment, an area of the conductive line M2_CL in the third direction d3 is greater than an area of the conductive line M1_CL in the third direction d3, but the disclosure is not limited thereto. For example, a width wL2 of the conductive line M2_CL in the first direction d1 may be greater than a width wL1 of the conductive line M1_CL in the first direction d1, so that the area of the conductive line M2_CL in the third direction d3 is greater than the area of the conductive line M1_CL in the third direction d3, but the disclosure is not limited thereto.

Figure 6:
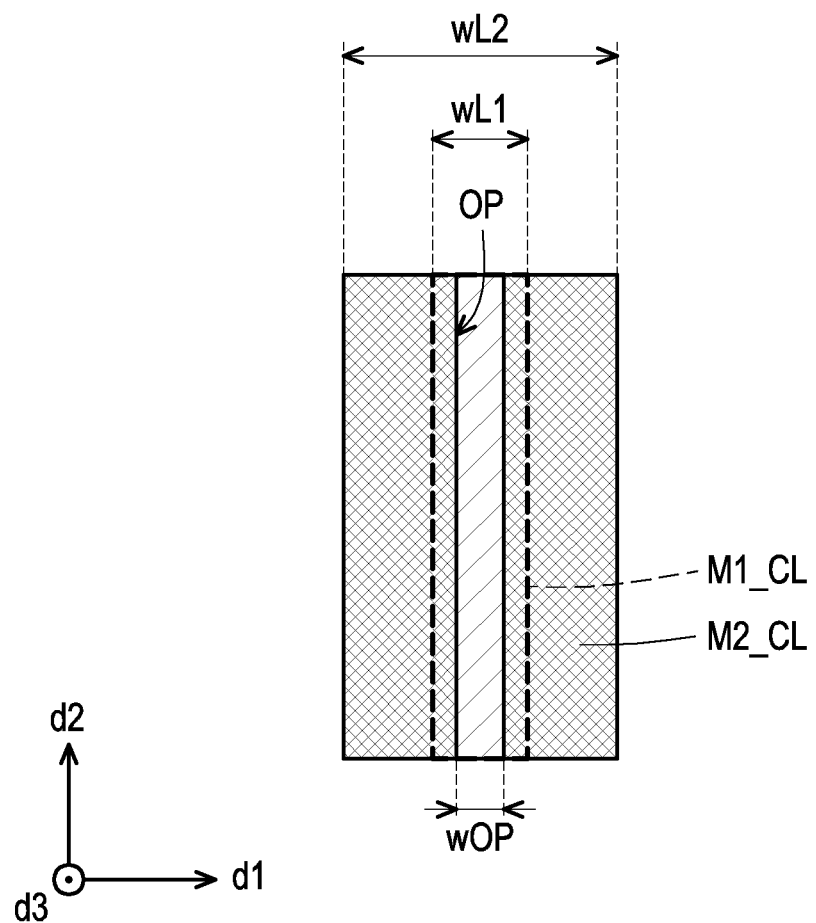
FIG. 6 is a partial schematic top view of arrangement among conductive layers of an electronic device according to another embodiment.

FIG. 6 is a partial schematic top view of arrangement among conductive layers of an electronic device according to another embodiment. It should be noted that the embodiment of FIG. 6 can respectively use the reference marks and part of the technical contents of the embodiments of FIG. 5A, wherein the same or similar reference marks are used to represent the same or similar elements, and description of technical content pertaining the same technology is omitted.

Referring to FIG. 6, a main difference between the present embodiment and the preceding embodiment shown in FIG. 5A is that the insulating layer IL2 has an opening OP extending along the extending direction of the conductive lines, wherein the opening OP exposes a portion of the conductive line M1_CL, and the opening OP and the conductive line M2_CL as well as the conductive line M1_CL extend along the same direction. For example, the opening OP and the conductive line M2_CL as well as the conductive line M1_CL may extend along the second direction d2, but the disclosure is not limited thereto. In some embodiments, a width wOP of the opening OP in the first direction d1 may be smaller than the width wL1 of the conductive line M1_CL in the first direction d1. In the present embodiment, the conductive line M2_CL can also be electrically connected to the conductive line M1_CL through the opening OP of the insulating layer IL2.

Figure 7A:
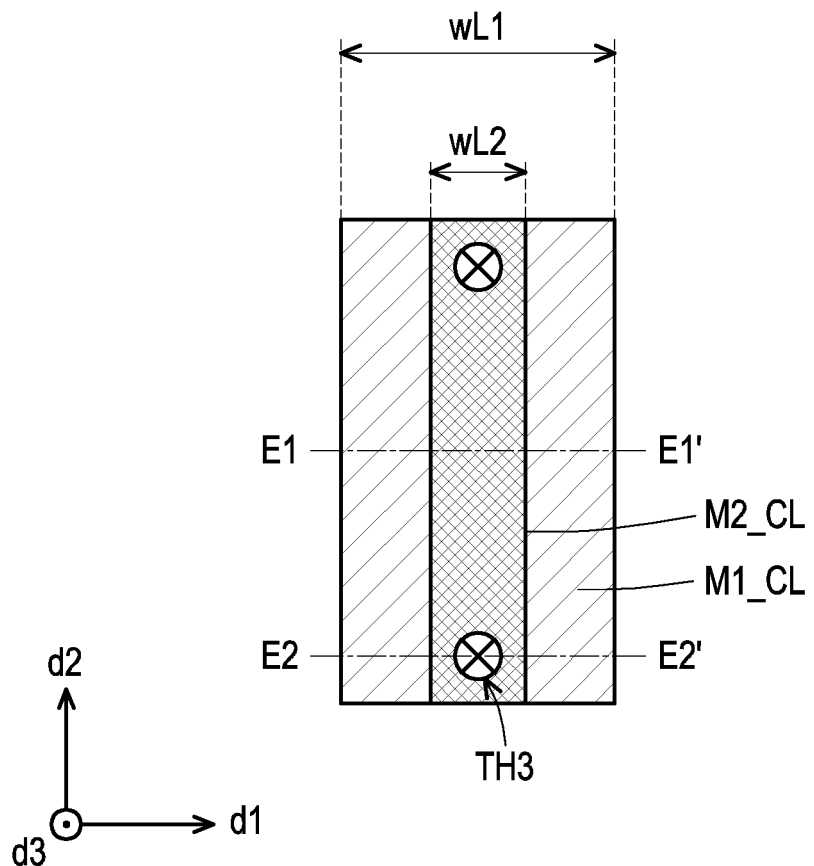
FIG. 7A is a partial schematic top view of arrangement among conductive layers of an electronic device according to yet another embodiment.
Figure 7B:
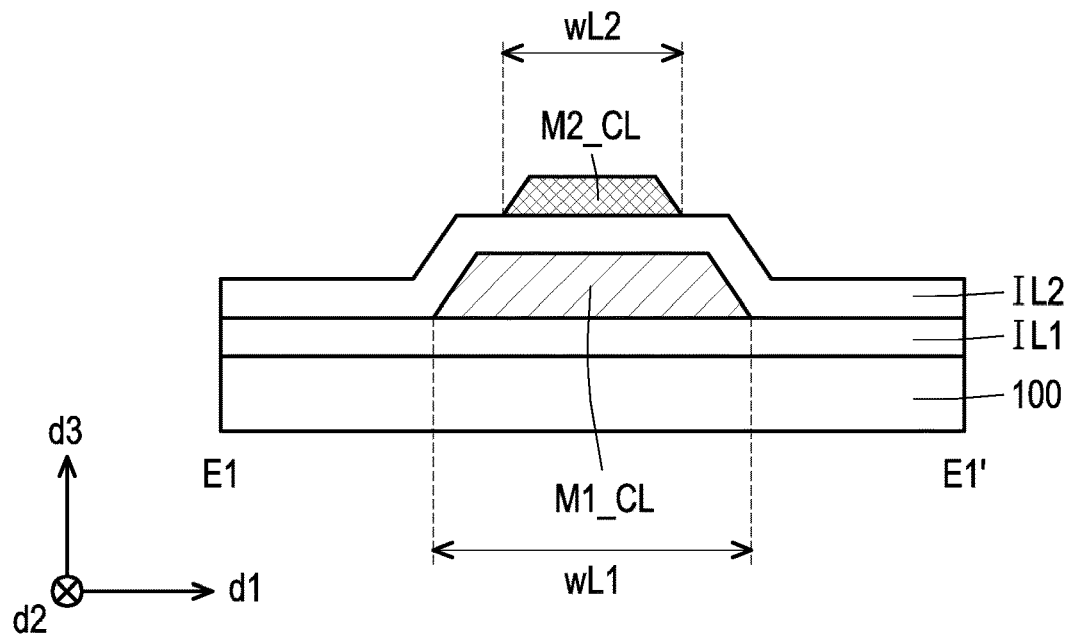
FIG. 7B is a partial schematic cross-sectional view of an embodiment according to a section line E1-E1' of FIG. 7A.
Figure 7C:
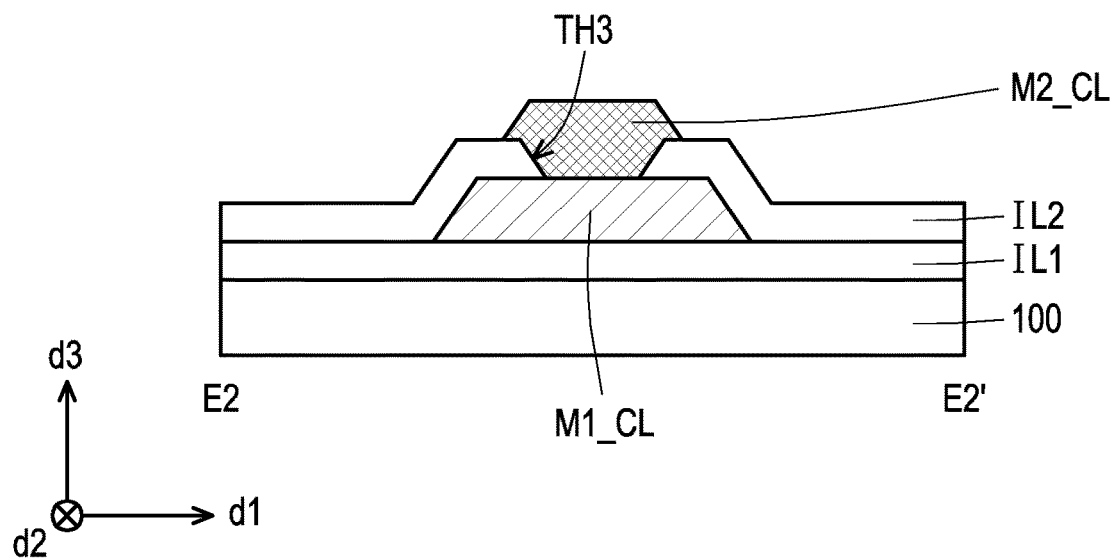
FIG. 7C is a partial schematic cross-sectional view of an embodiment according to a section line E2-E2' of FIG. 7A.

FIG. 7A is a partial schematic top view of arrangement among conductive layers of an electronic device according to yet another embodiment, FIG. 7B is a partial schematic cross-sectional view of an embodiment according to a section line E1-E1' of FIG. 7A, and FIG. 7C is a partial schematic cross-sectional view of an embodiment according to a section line E2-E2' of FIG. 7A. It should be noted that the embodiments of FIGS. 7A to 7C can respectively use the reference marks and part of the technical contents of the embodiments of FIGS. 5A to 5C, wherein the same or similar reference marks are used to represent the same or similar elements, and description of technical content pertaining the same technology is omitted.

Referring to FIGS. 7A to 7C, a main difference between the present embodiment and the preceding embodiment shown in FIGS. 5A to 5C is that the area of the conductive line M2_CL in the third direction d3 is smaller than that of the conductive line M1_CL in the third direction d3. For example, the width wL2 of the conductive line M2_CL in the first direction d1 may be smaller than the width wL1 of the conductive line M1_CL in the first direction d1, so that the area of the conductive line M2_CL in the third direction d3 is smaller than the area of the conductive line M1_CL in the third direction d3, but the disclosure is not limited to thereto. In the present embodiment, the conductive line M2_CL can also be electrically connected to the conductive line M1_CL through the through hole TH3 of the insulating layer IL2.

Based on the above, in the electronic device provided by some embodiments of the disclosure, there is the first distance between the driving element and the edge of the conductive layer, and there is the second distance between the electronic element and the edge of the conductive layer. The capacitive load of the electronic device can be reduced by making the first distance smaller than the second distance since the overlapping area of the conductive layer and the first conductive line is reduced. In addition, in the electronic device provided by some embodiments of the present disclosure, the first conductive line has the first width outside the conductive layer, and the first conductive line has the second width on the edge of the conductive layer. The occurrence of disconnection or peeling of the first conductive line at the edge of the conductive layer is reduced by making the first width smaller than the second width since the terrain difference is reduced. Furthermore, the electronic device provided by some embodiments of the present disclosure is provided with transition lines for signal lines, and the transition lines and the signal line are separated by at least one insulating layer, so that the distance between the transition lines and the conductive layer can be increased. The distance between the transition lines and the conductive layer can reduce the impedance of the signal lines. Moreover, in the electronic device provided by some embodiments of the present disclosure, the impedance of the signal lines can be reduced by stacking the signal line with the conductor line of the conductive layer in parallel. In summary, the reliability of the electronic device provided by the embodiments of the present disclosure has been improved.

Lastly, it is to be noted that: the embodiments described above are only used to illustrate the technical solutions of the disclosure, and not to limit the disclosure; although the disclosure is described in detail with reference to the embodiments, those skilled in the art should understand: it is still possible to modify the technical solutions recited in the embodiments, or to equivalently replace some or all of the technical features; the modifications or replacements do not cause the essence of the corresponding technical solutions to deviate from the scope of the technical solutions of the embodiments. The features of the embodiments may be arbitrarily mixed and combined as long as they do not depart from or conflict with the spirit of the disclosure.

What is claimed is:

1. An electronic device, including:
a substrate;
a driving element, disposed on the substrate;
a conductive layer, disposed on the substrate, wherein there is a first distance (B) between the driving element and an edge of the conductive layer;
an electronic element, disposed on the conductive layer and electrically connected to the driving element, wherein there is a second distance (A) between the electronic element and the edge of the conductive layer; and
a first conductive line, wherein the first conductive line is electrically connected to the driving element and the electronic element, the first conductive line located outside the conductive layer has a first width (w1), and the first conductive line located on the edge of the conductive layer has a second width (w2), and the first width (w1) is smaller than the second width (w2), wherein the first distance (B) is greater than the second distance (A).

2. The electronic device according to claim 1, including a plurality of the electronic elements, wherein the plurality of electronic elements are disposed on the conductive layer at intervals.

3. The electronic device according to claim 1, wherein the first distance (B) and the second distance (A) satisfy following relationship: $B/(A+B) \geq 50\%$.

4. The electronic device according to claim 1, wherein the first width (w1) and the second width (w2) satisfy following relationship: $w2=w1*1.1$.

5. The electronic device according to claim 1, wherein the first conductive line includes a first portion not overlapping the conductive layer and a second portion overlapping the conductive layer at the edge of the conductive layer, and a length of the first portion is greater than a length of the second portion.

6. The electronic device according to claim 1, wherein the first conductive line has a plurality of branch portions, the plurality of branch portions extend from a location outside the conductive layer to the conductive layer.

7. The electronic device according to claim 1, wherein the edge of the conductive layer includes a non-linear portion, and the first conductive line is located on the non-linear portion.

8. The electronic device according to claim 7, wherein the non-linear portion of the conductive layer includes a zigzag shape, a wave shape, an arc shape, or a combination thereof.

9. The electronic device according to claim 1, further including a thin film transistor and a second conductive line, wherein the thin film transistor is disposed on the substrate and includes a first electrode, the second conductive line is electrically connected to the first electrode through a first through hole, wherein a distance between the second conductive line and the conductive layer is greater than a distance between the first electrode and the conductive layer in a normal direction of the substrate.

10. The electronic device according to claim 9, further including a third conductive line, wherein the thin film transistor includes a second electrode, the third conductive line is electrically connected to the second electrode through a second through hole, wherein a distance between the third conductive line and the conductive layer is greater than a distance between the second electrode and the conductive layer in the normal direction of the substrate.

11. The electronic device according to claim 10, wherein the second conductive line and the third conductive line belong to different layers.

12. The electronic device according to claim 9, further including a storage capacitance, wherein the storage capacitance is disposed on the substrate, and the storage capacitance is electrically connected to the thin film transistor.

13. The electronic device according to claim 1, further including:
a fourth conductive line, disposed on the substrate; and
a fifth conductive line, overlapping the fourth conductive line and electrically connected to the fourth conductive line through a through hole,
wherein the fifth conductive line and the fourth conductive line extend along the same direction.

14. The electronic device according to claim 13, wherein the through hole and the fifth conductive line as well as the fourth conductive line extend along the same direction.

15. The electronic device according to claim 13, wherein a width of the fourth conductive line is greater than a width of the fifth conductive line.

16. The electronic device according to claim 13, wherein a width of the fourth conductive line is smaller than a width of the fifth conductive line.

17. The electronic device according to claim 1, further including an active area and a peripheral area, wherein the peripheral area is located at least one side of the active area.

18. The electronic device according to claim 17, further including:
   a test pad, located in the peripheral area and overlapping the conductive layer, wherein the test pad and the electronic element are electrically connected to each other through a test connection line.

19. The electronic device according to claim 18, wherein the driving element is located in the peripheral area, and the driving element is disposed on a side of the active area different from that of the test pad.

\* \* \* \* \*